United States Patent
Ukigaya et al.

(10) Patent No.: US 11,430,822 B2
(45) Date of Patent: Aug. 30, 2022

(54) PHOTOELECTRIC CONVERSION APPARATUS AND CAMERA

(71) Applicant: CANON KABUSHIKI KAISHA, Tokyo (JP)

(72) Inventors: Nobutaka Ukigaya, Yokohama (JP); Hideshi Kuwabara, Yamato (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/717,252

(22) Filed: Dec. 17, 2019

(65) Prior Publication Data
US 2020/0127026 A1  Apr. 23, 2020

Related U.S. Application Data

(63) Continuation of application No. 15/468,865, filed on Mar. 24, 2017, now Pat. No. 10,553,634.

(30) Foreign Application Priority Data

Mar. 31, 2016 (JP) .................. 2016-072989

(51) Int. Cl.
*H01L 27/146* (2006.01)
*H04N 5/378* (2011.01)
(Continued)

(52) U.S. Cl.
CPC ...... *H01L 27/1463* (2013.01); *H01L 27/1464* (2013.01); *H01L 27/14689* (2013.01);
(Continued)

(58) Field of Classification Search
CPC .......... H01L 27/1463; H01L 27/14689; H01L 27/1464; H01L 27/14641; H01L 27/14621; H01L 27/14645; H01L 27/14612; H01L 27/14627; H04N 5/378; H04N 5/23293; H04N 5/76; H04N 5/2253; H04N 5/374
See application file for complete search history.

(56) References Cited

U.S. PATENT DOCUMENTS 7,586,139 B2    9/2009   Adkisson et al.
8,247,306 B2    8/2012   Nakazawa
(Continued)

FOREIGN PATENT DOCUMENTS

CN    1487590 A    4/2004
CN    1873986 A    12/2006
(Continued)

OTHER PUBLICATIONS

US 2006/0102973 A1, 05/2006, Adkisson et al. (withdrawn)

*Primary Examiner* — Abdelaaziz Tissire
(74) *Attorney, Agent, or Firm* — Canon U.S.A., Inc. IP Division

(57) ABSTRACT

A photoelectric conversion apparatus includes an element isolating portion that is disposed on a side of a front surface of a semiconductor layer and constituted by an insulator, and a pixel isolating portion. The pixel isolating portion includes a part that overlaps an isolating region in a normal direction. The semiconductor layer is continuous across semiconductor regions in an intermediate plane. The part is located between a semiconductor region and another semiconductor region.

29 Claims, 9 Drawing Sheets

(51) Int. Cl.
*H04N 5/232* (2006.01)
*H04N 5/76* (2006.01)

(52) U.S. Cl.
CPC ....... *H04N 5/378* (2013.01); *H01L 27/14612* (2013.01); *H01L 27/14621* (2013.01); *H01L 27/14627* (2013.01); *H01L 27/14641* (2013.01); *H01L 27/14645* (2013.01); *H04N 5/23293* (2013.01); *H04N 5/76* (2013.01)

(56) References Cited

U.S. PATENT DOCUMENTS

| | | | |
|---|---|---|---|
| 8,274,122 B2 | 9/2012 | Shimotsusa | |
| 9,064,762 B2 | 6/2015 | Yamaguchi | |
| 9,094,624 B2* | 7/2015 | Shimotsusa | H04N 5/355 |
| 9,305,947 B2 | 4/2016 | Ihara | |
| 9,508,768 B2 | 11/2016 | Kokumai | |
| 9,876,044 B2* | 1/2018 | Lee | H01L 27/14621 |
| 2002/0093074 A1 | 7/2002 | Bertin | |
| 2005/0269604 A1* | 12/2005 | Koizumi | H01L 27/14609 257/E31.038 |
| 2006/0043439 A1* | 3/2006 | Koizumi | H01L 27/14609 257/291 |
| 2006/0197007 A1* | 9/2006 | Iwabuchi | H01L 27/14638 250/208.1 |
| 2007/0194397 A1 | 8/2007 | Adkisson et al. | |
| 2010/0237451 A1* | 9/2010 | Murakoshi | H01L 21/76898 257/E31.127 |
| 2011/0068252 A1* | 3/2011 | Kawabata | H01L 27/14607 257/292 |
| 2011/0073923 A1* | 3/2011 | Tatani | H01L 27/14609 438/59 |
| 2011/0127408 A1* | 6/2011 | Yanagita | H01L 27/14603 250/208.1 |
| 2011/0134270 A1* | 6/2011 | Arishima | H01L 27/14887 348/222.1 |
| 2011/0169989 A1* | 7/2011 | Kono | H04N 5/335 257/443 |
| 2011/0180689 A1* | 7/2011 | Roy | H01L 27/14609 438/73 |
| 2011/0291219 A1* | 12/2011 | Kwon | H01L 27/1463 257/447 |
| 2013/0049082 A1* | 2/2013 | Kato | H01L 27/14603 257/292 |
| 2013/0099291 A1* | 4/2013 | Shimotsusa | H01L 27/14634 257/225 |
| 2013/0264467 A1* | 10/2013 | Hong | H01L 27/14641 250/208.1 |
| 2014/0008705 A1* | 1/2014 | Choi | H01L 27/1464 257/255 |
| 2014/0111664 A1* | 4/2014 | Kumano | H01L 27/1464 348/222.1 |
| 2015/0041872 A1 | 2/2015 | Yoshihara | |
| 2015/0054997 A1* | 2/2015 | Hynecek | H04N 9/04559 257/292 |
| 2015/0145087 A1* | 5/2015 | Iwata | H01L 27/14609 438/73 |
| 2015/0147843 A1* | 5/2015 | Onuki | H01L 21/26513 438/59 |
| 2015/0214269 A1* | 7/2015 | Endo | H01L 21/02321 257/443 |
| 2015/0243694 A1* | 8/2015 | Ihara | H01L 27/14605 257/443 |
| 2016/0079297 A1 | 3/2016 | Sato | |
| 2016/0284758 A1* | 9/2016 | Hirota | H01L 27/1463 |
| 2016/0360126 A1* | 12/2016 | Soda | H01L 27/14612 |
| 2018/0026073 A1* | 1/2018 | Tsuboi | H01L 27/14683 257/225 |
| 2018/0061873 A1* | 3/2018 | Lee | H01L 27/14665 |
| 2019/0131340 A1* | 5/2019 | Kim | H01L 27/14621 |

FOREIGN PATENT DOCUMENTS

| | | |
|---|---|---|
| CN | 1941388 A | 4/2007 |
| CN | 101834195 A | 9/2010 |
| CN | 102017153 A | 4/2011 |
| CN | 103035661 A | 4/2013 |
| CN | 103579274 A | 2/2014 |
| CN | 103824869 A | 5/2014 |
| EP | 2109143 B1 | 5/2013 |
| JP | 61-263266 A | 11/1986 |
| JP | 2005-353994 A | 12/2005 |
| JP | 2009-252984 A | 10/2009 |
| JP | 2009-272596 A | 11/2009 |
| JP | 2010-123841 A | 6/2010 |
| JP | 2010-212471 A | 9/2010 |
| JP | 2011-91368 A | 5/2011 |
| JP | 2011-114323 A | 6/2011 |
| JP | 2013-041915 A | 2/2013 |
| JP | 2013-175494 A | 9/2013 |
| JP | 2014-204047 A | 10/2014 |
| JP | 2015-103629 A | 6/2015 |
| JP | 2015-153912 A | 8/2015 |
| JP | 2015-162679 A | 9/2015 |

* cited by examiner

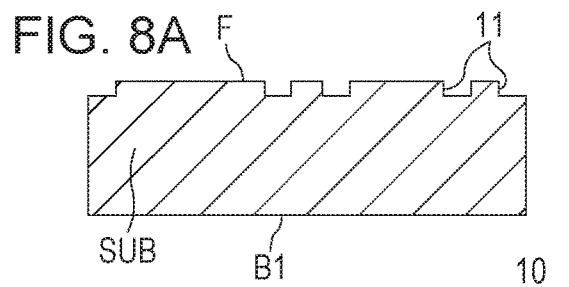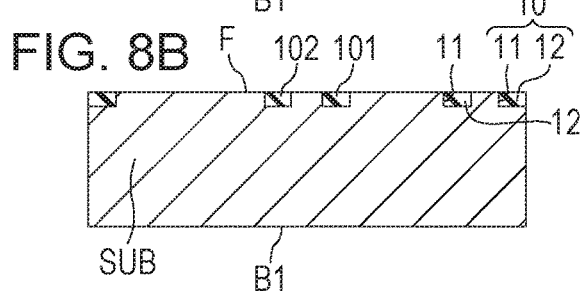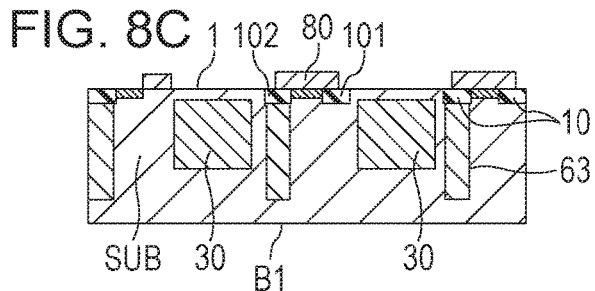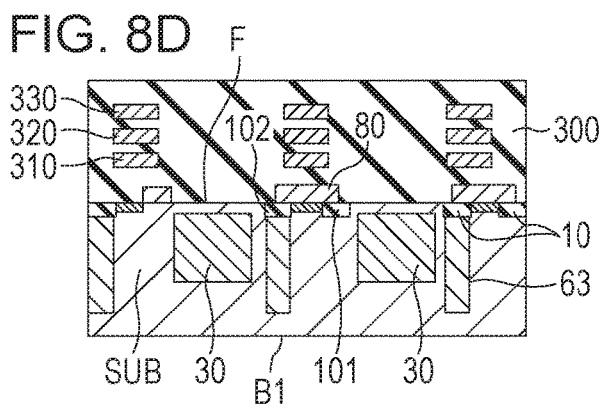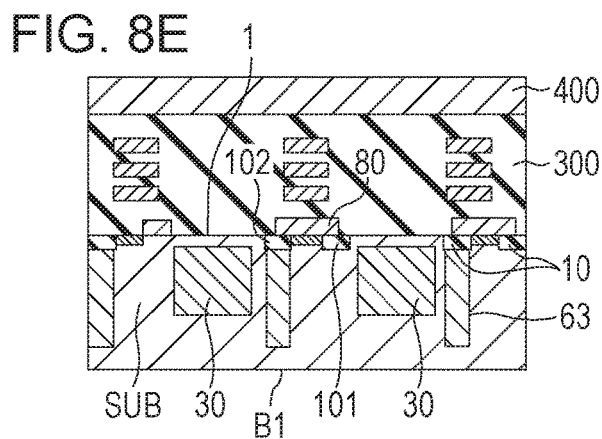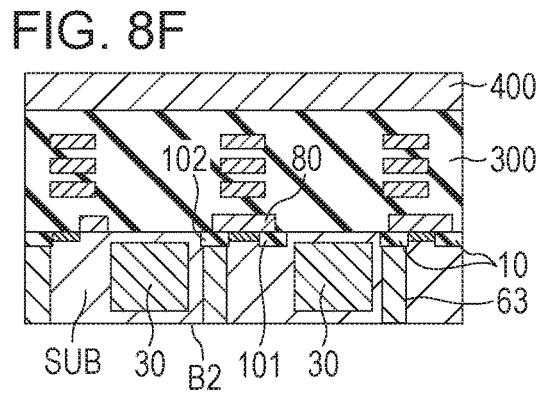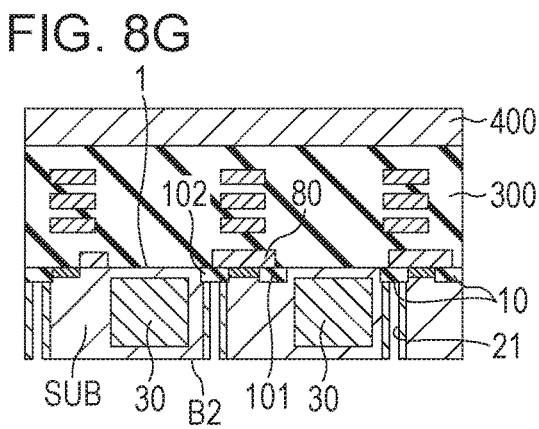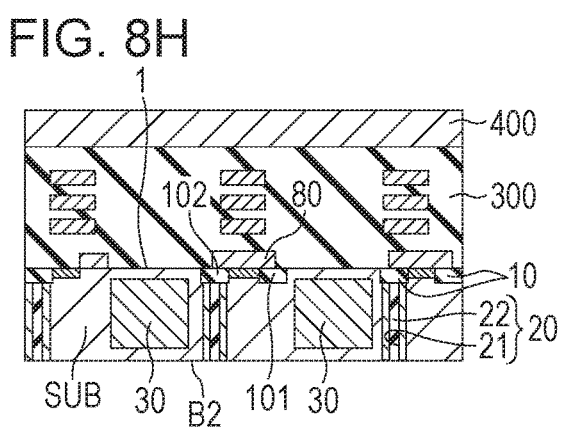

PHOTOELECTRIC CONVERSION APPARATUS AND CAMERA

CROSS-REFERENCE TO RELATED APPLICATION

This application is a Continuation of U.S. application Ser. No. 15/468,865, filed Mar. 24, 2017, which claims priority from Japanese Patent Application No. 2016-072989 filed Mar. 31, 2016, which are hereby incorporated by reference herein in their entireties.

BACKGROUND OF THE INVENTION

Field of the Invention

The present disclosure relates to a photoelectric conversion apparatus.

Description of the Related Art

There has been a study on providing a groove in a semiconductor layer in a photoelectric conversion apparatus, such as a complementary metal-oxide semiconductor (CMOS) image sensor, for use in a camera. As an isolating portion constituted by the groove acts as a barrier for light, an electric charge, and so on, the sensitivity improves, and color mixing is suppressed. Thus, photoelectric conversion performance can be improved.

Japanese Patent Laid-Open No. 2014-204047 discloses an element isolation constituted by a space and an insulator. The space and the insulator are disposed in a groove.

An investigation into the groove disclosed in Japanese Patent Laid-Open No. 2014-204047 has revealed that the sensitivity of the photoelectric conversion unit may decrease depending on the arrangement of the groove.

SUMMARY OF THE INVENTION

One disclosed aspect of the embodiments is directed to providing a photoelectric conversion apparatus with improved photoelectric conversion performance. One embodiment provides a photoelectric conversion apparatus that includes a semiconductor layer having a first surface and a second surface, the second surface being opposite to the first surface; a first isolating portion disposed on a side of the first surface, the first isolating portion being constituted by an insulator; and a second isolating portion disposed so as to pass through a plane extending along the second surface, the plane being located closer to the second surface than the first isolating portion is, the second isolating portion being constituted by a groove provided in the semiconductor layer. The semiconductor layer includes, as element regions defined by the first isolating portion, a first element region where a first photoelectric conversion element is provided, a second element region where a second photoelectric conversion element is provided, and a third element region disposed between the first element region and the second element region, the third element region having a different shape from the first element region and the second element region. The first isolating portion includes a first isolating region located between the first element region and the third element region, and a second isolating region located between the second element region and the third element region. The semiconductor layer includes a first semiconductor region located between the first element region and the second surface in a normal direction with respect to the first surface, a second semiconductor region located between the second element region and the second surface in the normal direction, a third semiconductor region located between the third element region and the second surface in the normal direction, and a fourth semiconductor region located between the first isolating region and the second surface in the normal direction. The second isolating portion includes a part that overlaps the second isolating region in the normal direction. In the plane, the first semiconductor region and the third semiconductor region are continuous via the fourth semiconductor region, and the part is located between the second semiconductor region and the third semiconductor region. The first photoelectric conversion element includes a first impurity region of a first conductivity type in which a signal charge is a majority carrier, and a second impurity region of a second conductivity type in which a signal charge is a minority carrier, and a distance between the first impurity region and the part is greater than a distance between the first impurity region and the first isolating region.

Further features of the embodiments will become apparent from the following description of exemplary embodiments with reference to the attached drawings.

BRIEF DESCRIPTION OF THE DRAWINGS

FIGS. 8A, 8B, 8C, 8D, 8E, 8F, 8G, and 8H are schematic diagrams for illustrating a method of manufacturing a photoelectric conversion apparatus.

DESCRIPTION OF THE EMBODIMENTS

Figure 1A:
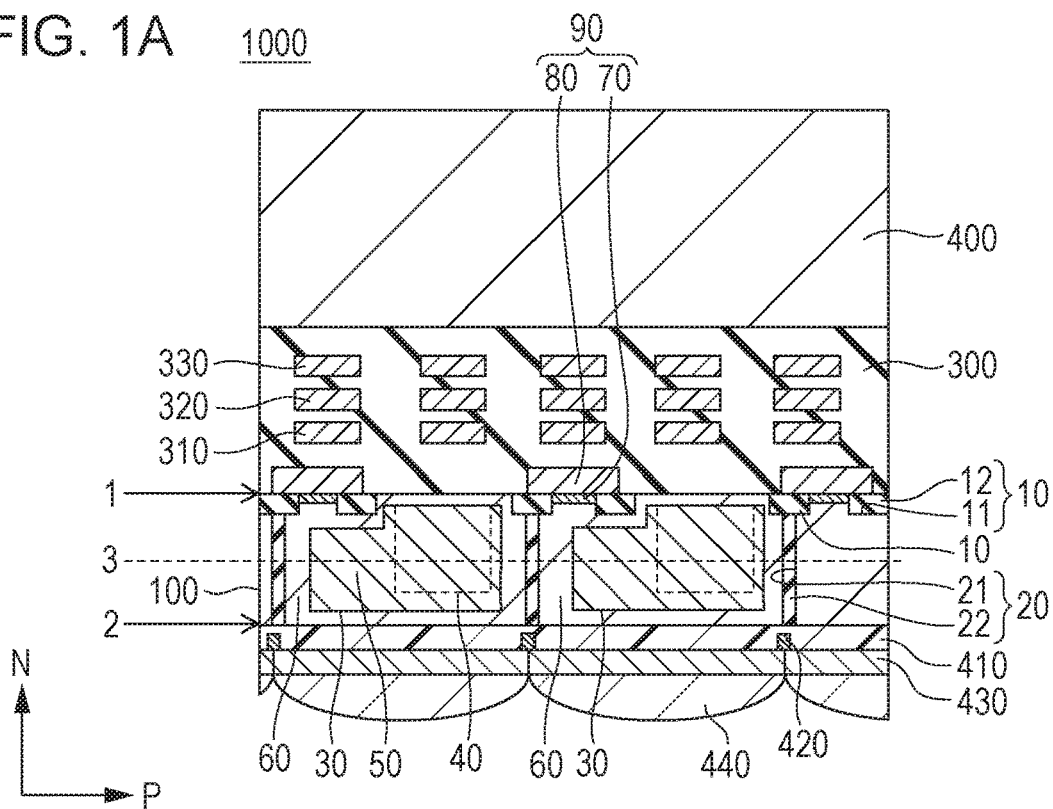
FIGS. 1A and 1B are schematic diagrams for illustrating a back-side and front-side, respectively, illuminated imaging apparatus as examples of a photoelectric conversion apparatus.

Hereinafter, exemplary embodiment for implementing the disclosure will be described with reference to the drawings. According to the present exemplary embodiments, a photoelectric conversion apparatus with improved photoelectric conversion performance can be provided. In the following description and in the drawings, components that are common across a plurality of drawings are given common reference characters. Thus, such common components are described by cross-referencing a plurality of drawings, and descriptions of component given common reference characters will be omitted as appropriate.

Figure 1B:
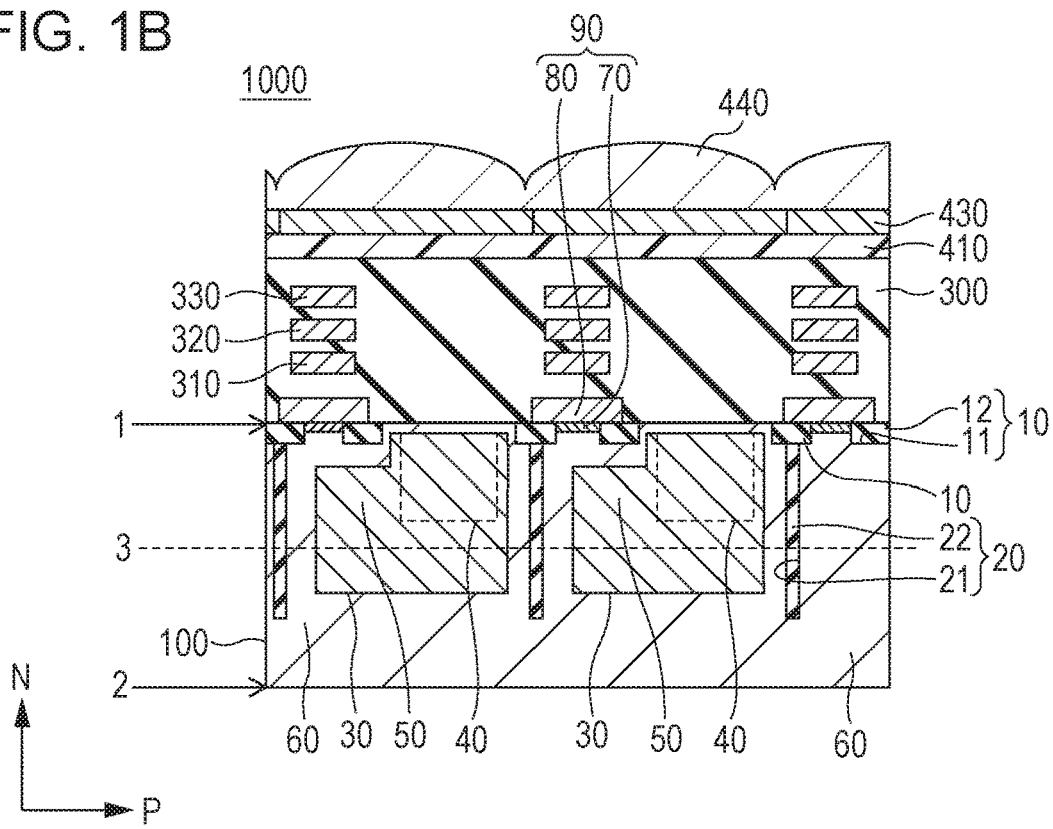

FIG. 1A is a sectional view illustrating an exemplary embodiment of a back-side illuminated imaging apparatus, which serves as an example of a photoelectric conversion apparatus. FIG. 1B is a sectional view illustrating an exemplary embodiment of a front-side illuminated imaging apparatus, which serves as another example of the photoelectric conversion apparatus. First, features that are common to both a back-side illuminated type and a front-side illuminated type will be described.

A photoelectric conversion apparatus 1000 includes a semiconductor layer 100 having a front surface 1 and a back surface 2, which is opposite to the front surface 1. The semiconductor layer 100 is, for example, a single crystal silicon layer, but the semiconductor layer 100 is not limited to a single crystal silicon layer and can be any semiconductor layer capable of photoelectric conversion. The photoelectric conversion apparatus 1000 further includes an element isolating portion 10 provided on a side of the front surface 1 to the semiconductor layer 100, and the element isolating portion 10 is constituted by a groove 11 in the semiconductor layer 100 and an insulator 12 in the groove 11. The element isolating portion 10 may have a shallow trench isolation (STI) structure or a local oxidation of silicon (LOCOS) structure. The insulator 12 that partially constitutes the element isolating portion 10 is made of, for example, silicon oxide. The photoelectric conversion apparatus 1000 further includes a pixel isolating portion 20, which is constituted by a groove 21 provided in the semiconductor layer 100. The pixel isolating portion 20 is disposed so as to pass through an intermediate plane 3. The intermediate plane 3 is a virtual plane that is located closer to the back surface 2 than the element isolating portion 10 is and that extends along the front surface 1 and/or the back surface 2. The intermediate plane 3 may be parallel to the back surface 2. The direction perpendicular to the intermediate plane 3 is referred to as a normal direction N, and the direction parallel to the intermediate plane 3 is referred to as an in-plane direction P. In the normal direction N, the pixel isolating portion 20 extends toward both the front surface 1 and the back surface 2 from the intermediate plane 3. The semiconductor layer 100 is discontinuous with the pixel isolating portion 20 interposed therein within the intermediate plane 3. A solid 22 may be present in the groove 21 in the pixel isolating portion 20, the space within the groove 21 may be in vacuum, a gas may be present in the groove 21, or a gas and the solid 22 may both be present in the groove 21. The solid 22 that can be present in the groove 21 may be an insulator, a conductor, or a semiconductor. A typical insulator that can serve as the solid 22 present in the groove 21 is silicon oxide, but silicon nitride, silicon oxynitride, tantalum oxide, hafnium oxide, titanium oxide, or the like can also be used. A typical conductor that can serve as the solid 22 present in the groove 21 is metal or polysilicon, but aluminum, copper, tungsten, titanium, titanium nitride, tantalum, tantalum nitride, metal silicide, or the like can also be used. A typical semiconductor that can serve as the solid 22 present in the groove 21 is a single crystal silicon, but amorphous silicon may also be used. The conductivity type of a semiconductor that serves as the solid 22 present in the groove 21 may be a conductivity type that is opposite to a signal charge accumulated in a photoelectric conversion element, which will be described later.

A photoelectric conversion element 30 is provided between the front surface 1 and the back surface 2 of the semiconductor layer 100. The photoelectric conversion element 30 is a photodiode. The photoelectric conversion element 30, serving as a photodiode, includes an n-type impurity region 40 that functions as an accumulation region for accumulating signal charges (electrons) and a p-type impurity region 50 that forms a pn junction with the impurity region 40. Electrons generated through photoelectric conversion in the p-type impurity region 50 are accumulated in the impurity region 40. The impurity region 40 may be located within the intermediate plane 3. The impurity region 50 is located between the intermediate plane 3 and the back surface 2. Although an electron accumulating photodiode has been illustrated as an example, a hole accumulating photodiode can also be employed. In that case, the conductivity types of the impurity regions may be reversed from those of the electron accumulation type. The conductivity type in which the signal charges are the majority carrier is set as a first conductivity type, and the conductivity type in which the signal charges are the minority carrier is set as a second conductivity type. When the signal charges are electrons, an n-type in which the electrons are the majority carrier is the first conductivity type. It is to be noted that a portion that is regarded as the photoelectric conversion element 30 in the semiconductor layer 100 is a portion generated by subjecting electric charges read out as the signal charges to photoelectric conversion. In a strict sense, the portion that is regarded as the photoelectric conversion element 30 is determined by an impurity concentration distribution in the semiconductor layer 100 and a potential profile that is based on an applied voltage.

A pixel transistor 90 is provided in the front surface 1 of the semiconductor layer 100. In FIGS. 1A and 1B, the pixel transistor 90 includes a channel region 70 and a gate electrode 80. The pixel transistor 90 includes a transfer transistor, an amplification transistor, a reset transistor, a selection transistor, and the like (not shown). The transfer transistor transfers the signal charges of the photoelectric conversion element 30 to an electric charge detection region. The electric charge detection region is constituted by a floating diffusion region (floating diffusion). The amplification transistor generates a signal based on an electric charge with a source follower circuit and includes a gate connected to the electric charge detection region. The reset transistor includes a drain connected to the electric charge detection region and resets the electric charge of the photoelectric conversion element 30. The selection transistor selects between connection and disconnection of the amplification transistor and an output wire.

A portion of the semiconductor layer 100 that is outside the photoelectric conversion element 30 is constituted by a p-type impurity region 60. The p-type impurity region 60 has a higher impurity concentration than the impurity region 50, which is also of a p-type. A portion of the impurity region 60 may function as a potential barrier that suppresses mixing of electric charges between pixels. In addition, a portion of the impurity region 60 may function as a potential barrier that prevents a noise electric charge generated at an interface between the semiconductor layer 100 and the insulator 12 from being taken into the photoelectric conversion element 30. The impurity region 60 includes a dense p-type well contact to which a conductive member that supplies a fixed potential such as a ground potential is connected. A potential is supplied to the impurity region 40 of the photoelectric conversion element 30 from the well contact via the impurity region 60.

The pixel isolating portions 20 are disposed so as to surround the photoelectric conversion element 30. The pixel isolating portion 20 has a configuration that makes it possible to suppress color mixing between neighboring pixels. In a semiconductor region surrounded by the pixel isolating portions 20 disposed around the photoelectric conversion element 30, aside from the impurity region 40, the pixel transistor 90 disposed so as to be isolated by the element isolating portion 10 is included. In other words, not only the photoelectric conversion element 30 but also a semiconductor region (for example, semiconductor regions 124, 125, and 126, which will be described later) underneath the element isolating portion 10 is included between the pixel isolating portions 20 that are adjacent to and face each other in the intermediate plane 3. In addition, a semiconductor region (for example, a semiconductor region 123, which will be described later) underneath the pixel transistor 90 isolated from the photoelectric conversion element 30 by the element isolating portion 10 is also included between the pixel isolating portions 20 that are adjacent to and face each other in the intermediate plane 3. In the examples illustrated in FIGS. 1A and 1B, the photoelectric conversion element 30 is disposed so as to extend into these semiconductor regions underneath the element isolating portion 10 and the pixel transistor 90.

An insulating film 300 constituted by a plurality of wiring layers 310, 320, and 330 and a plurality of interlayer insulating layers surrounding the wiring layers 310, 320, and 330 is provided on the front surface 1. Output wires constituted by the wiring layers 310, 320, and 330 are provided so as to output the signal charges generated by the photoelectric conversion element 30 to a following stage in the form of electric signals via the pixel transistor 90.

In the back-side illuminated imaging apparatus illustrated in FIG. 1A, a dielectric film 410, a light blocking member 420, a color filter array 430, and a microlens array 440 are provided on the back surface 2. The dielectric film 410 functions as a protective film (passivation film), a planarizing film, and or an antireflection film. A supporting substrate 400 is provided on the insulating film 300 on the front surface 1. An integrated circuit such as a signal processing circuit can be provided on the supporting substrate 400. The semiconductor layer 100 has a thickness of approximately 1 µm to 10 µm. The supporting substrate 400 has a thickness of approximately 50 µm to 800 µm.

In the front-side illuminated imaging apparatus illustrated in FIG. 1B, the dielectric film 410, the color filter array 430, and the microlens array 440 are provided on the insulating film 300 on the front surface 1. The dielectric film 410 functions as a protective film (passivation film), a planarizing film, and/or an antireflection film. The semiconductor layer 100 has a thickness of approximately 50 µm to 800 µm.

The color filter array 430 is provided so as to selectively transmit only light at specific wavelengths. For example, color filters that transmit light at wavelengths of red, green, and blue may be arrayed. In addition, a pixel that transmits white light may be mixed therein. Each of the microlenses of the microlens array 440 that are disposed so as to correspond to the respective pixels is provided so as to condense the incident light onto the photoelectric conversion element 30.

Figure 2:
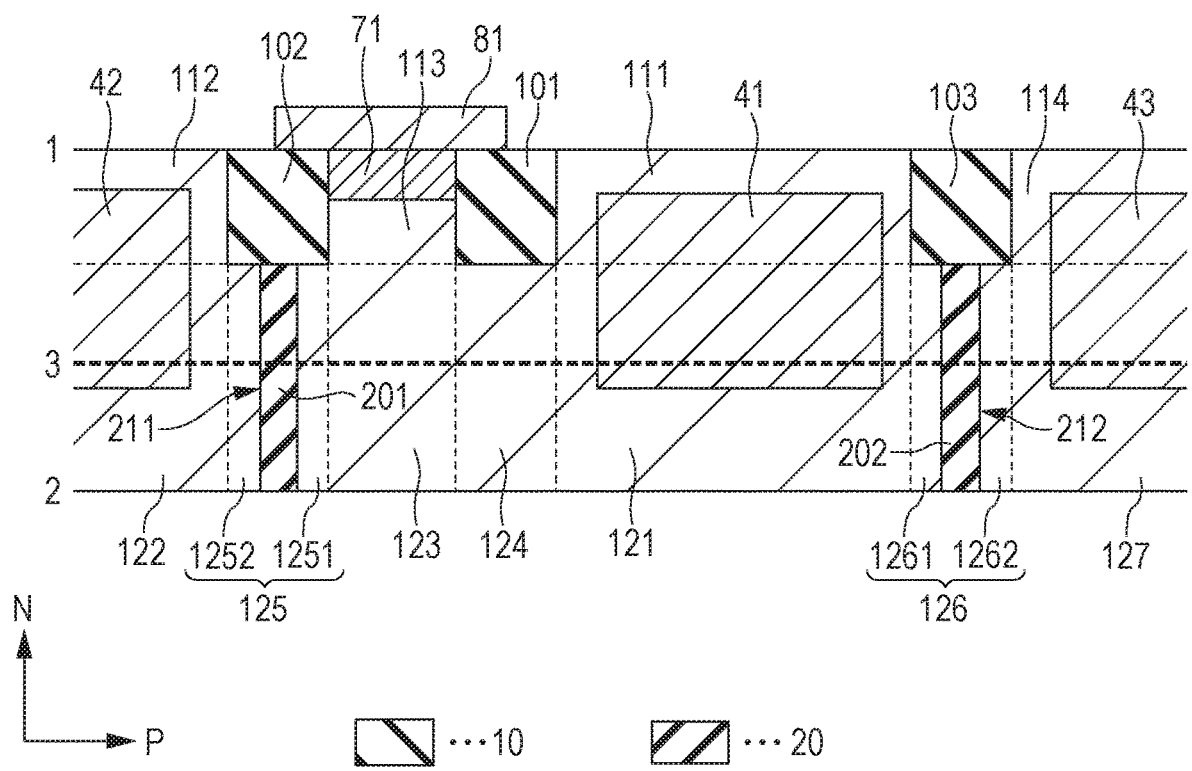
FIG. 2 is a schematic diagram for illustrating a semiconductor layer in the photoelectric conversion apparatus.

Next, the structure of the semiconductor layer 100 and the vicinity thereof will be described in detail with reference to FIG. 2.

The semiconductor layer 100 includes element regions defined by the element isolating portion 10. The element regions are distinguished by their positions with respect to the element isolating portion 10. The lower ends of the element regions in the depthwise direction coincide with the depth of the bottom surface of the element isolating portion 10. In FIG. 2, element regions 111, 112, 113, and 114 are illustrated as the element regions included in the semiconductor layer 100. A photoelectric conversion element 41 is provided in the element region 111, and a photoelectric conversion element 42 is provided in the element region 112. The element region 113 is disposed between the element region 111 and the element region 112, and semiconductor elements such as a transistor, a capacitative element (not shown), and a resistive element (not shown) are provided in the element region 113. The shape of the element region 113 differs from the shape of the element region 111 or the element region 112. The reason for this is that the semiconductor elements other than the photoelectric conversion element 30, such as a transistor, are provided in the element region 113. Typically, the area of the element region 113 is smaller than the area of the element region 111 or the element region 112.

In the present example, a pixel transistor is provided as the semiconductor element in the element region 113 described above. Although a channel region 71 is illustrated as an impurity region of the pixel transistor in FIG. 2, a source region and a drain region (not illustrated) are also provided in the element region 113. A gate electrode 81 of the pixel transistor is provided on the channel region 71. A photoelectric conversion element 43 is provided in the element region 114. It is to be noted that the regions that are indicated as the photoelectric conversion elements 41, 42, and 43 in FIG. 2 correspond to the n-type impurity region 40, which serves as an accumulation region of the photoelectric conversion element 30, in FIG. 1. Impurity regions corresponding to the p-type impurity region 50 that form the photoelectric conversion elements 41, 42, and 43 are present outside the regions indicated as the photoelectric conversion elements 41, 42, and 43.

The element isolating portion 10 includes isolating regions 101, 102, and 103. The isolating region 101 is located between the element region 111 and the element region 113. The isolating region 102 is located between the element region 112 and the element region 113. The isolating region 103 is located between the element region 111 and the element region 114.

The semiconductor layer 100 includes, toward the back surface 2 from the element isolating portion 10, semiconductor regions corresponding to the distribution of the element regions and the isolating regions on the front surface 1. The semiconductor regions toward the back surface 2 are distinguished by their positions with respect to the isolating regions of the element isolating portion 10 or the element regions. Each of the semiconductor regions is located between one of the isolating regions of the element isolating portion 10 or one of the element regions of the semiconductor layer 100 and the back surface 2 in the normal direction N. As such semiconductor regions, the semiconductor layer 100 includes semiconductor regions 121, 122, 123, 124, 125, 126, and 127. The semiconductor region 121 is located between the element region 111 and the back surface 2, the semiconductor region 122 is located between the element region 112 and the back surface 2, and the semiconductor region 123 is located between the element region 113 and the back surface 2. The semiconductor region 127 is located between the element region 114 and the back surface 2. The semiconductor region 124 is located between the isolating region 101 and the back surface 2, the semiconductor region 125 is located between the isolating region 102 and the back surface 2, and the semiconductor region 126 is located between the isolating region 103 and the back surface 2.

The pixel isolating portion 20 includes a first part 201 that overlaps the isolating region 102 in the normal direction N. The term "overlap" as used herein means that one entity extends over so as to cover partly or entirely another entity. The first part 201 is constituted by a groove 211 of the semiconductor layer 100. The first part 201 is located between the semiconductor region 122 and the semiconductor region 123 in the in-plane direction P. The semiconductor region 125 is divided into a plurality of parts by the first part 201. As a result, the semiconductor region 125 includes a part 1251 located between the first part 201 and the semiconductor region 123 and a part 1252 located between the first part 201 and the semiconductor region 122. In the present example, the first part 201 is connected to the isolating region 102. In addition, in the present example, the first part 201 is continuous with the back surface 2. In other words, the groove 21, which constitutes the first part 201, is continuous with the back surface 2. In a case in which the first part 201 and the isolating region 102 are to be spaced apart from each other, a portion of the semiconductor region 125 is disposed between the first part 201 and the isolating region 102. In a case in which the first part 201 and the back surface 2 are to be spaced apart from each other, a portion of the semiconductor region 125 is disposed between the first part 201 and the back surface 2.

The pixel isolating portion 20 includes a second part 202 that overlaps the isolating region 103 in the normal direction N. The second part 202 is constituted by a groove 212 of the semiconductor layer 100. The second part 202 is located between the semiconductor region 121 and the semiconductor region 127 in the in-plane direction P. The semiconductor region 126 is divided into a plurality of parts by the second part 202. As a result, the semiconductor region 126 includes a part 1261 located between the second part 202 and the semiconductor region 121 and a part 1262 located between the second part 202 and the semiconductor region 127. In the present example, the second part 202 is connected to the isolating region 103. In addition, in the present example, the second part 202 is continuous with the back surface 2. In other words, the groove 212, which constitutes the second part 202, is continuous with the back surface 2. In a case in which the second part 202 and the isolating region 103 are to be spaced apart from each other, a portion of the semiconductor region 126 is disposed between the second part 202 and the isolating region 103. In a case in which the second part 202 and the back surface 2 are to be spaced apart from each other, a portion of the semiconductor region 126 is disposed between the second part 202 and the back surface 2.

In this manner, the semiconductor region 122 and the semiconductor region 123 are discontinuous due to the first part 201. In addition, the semiconductor region 121 and the semiconductor region 127 are discontinuous due to the second part 202. With this configuration, mixing of light between the pixels is reduced, and the optical characteristics of the photoelectric conversion apparatus improve. In addition, mixing of electric charges between the pixels is reduced, and the electrical characteristics of the photoelectric conversion apparatus improve.

Meanwhile, the pixel isolating portion 20 is not provided between the isolating region 101 and the back surface 2. Therefore, the semiconductor region 121 and the semiconductor region 123 are continuous with each other with the semiconductor region 124 interposed therebetween in the intermediate plane 3. In other words, the element region 111, the element region 113, and the semiconductor layer 100 underneath the isolating region 101 are continuous with each other. In this manner, the semiconductor layer 100 is continuous underneath the isolating region 101 as the pixel isolating portion 20 is not provided. Thus, scattering of light by the groove 21 of the pixel isolating portion 20 is suppressed. Therefore, the quantity of light incident on the photoelectric conversion element 30 can be increased, and the sensitivity thus improves. In addition, as illustrated in FIGS. 1A, 1B, and 2, the distance between the photoelectric conversion element 41 (impurity region 40) and the first part 201 is greater than the distance between the photoelectric conversion element 41 (impurity region 40) and the isolating region 101. Furthermore, the distance between the photoelectric conversion element 41 (impurity region 40) and the second part 202 is greater than the distance between the photoelectric conversion element 41 (impurity region 40) and the isolating region 103. As the pixel isolating portion 20, which can be a noise source, is disposed away from the impurity region 40, which serves as an accumulation region of the photoelectric conversion element 30, in this manner, noise generated in the vicinity of the pixel isolating portion 20 can be prevented from being taken into the photoelectric conversion element 30. Furthermore, not only the element region 111 and the semiconductor region 121, but the semiconductor region 124 can also be used for the photoelectric conversion element 30. If the pixel isolating portion 20 is disposed in the semiconductor region 124, the volume of the photoelectric conversion element 30 is reduced by the amount corresponding to the volume of the pixel isolating portion 20, and thus the sensitivity decreases.

Furthermore, the semiconductor region 123 adjacent to the semiconductor region 124 can also be used for a photoelectric conversion element. If the pixel isolating portion 20 is disposed in the semiconductor region 124, the pixel isolating portion 20 prevents the movement of electric charges between the semiconductor region 123 and the semiconductor region 121. Therefore, it becomes difficult to effectively use the semiconductor region 123 as a photoelectric conversion element. By refraining from providing the pixel isolating portion 20 and by extending the photoelectric conversion element from the semiconductor region 121 to the semiconductor region 124 and further to the semiconductor region 123 in this manner, the sensitivity can be improved.

In the examples illustrated in FIGS. 1A and 1B, the photoelectric conversion element 30 is disposed so as to extend into a region corresponding to the semiconductor regions 123 and 124. This configuration makes it easier to make the center of the photoelectric conversion element 30 coincide with or be brought closer to the focus position of the microlens (typically, the optical axis of the microlens). In order to bring the focus position of the microlens closer to the center of the photodiode, the distance between the optical axis of the microlens and the isolating region 101 may be made smaller than the distance between the optical axis of the microlens and the isolating region 103. Such a configuration makes it possible to condense the light by the microlens at a position that is substantially equidistant from the first part 201 and the second part 202.

As described thus far, by disposing the pixel isolating portion 20 away from the semiconductor region 124, the photoelectric conversion performance can be improved in optical and electrical aspects.

Figure 3A:
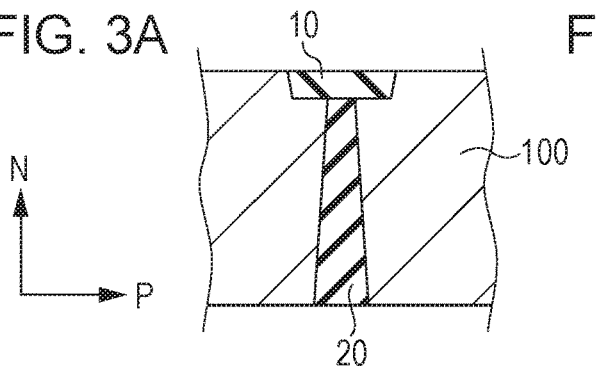
FIGS. 3A, 3B, 3C, and 3D illustrate modifications on the shape of and/or the positional relationship between the element isolating portion and the pixel isolating portion.

FIGS. 3A through 3D illustrate modifications on the shape of and/or the positional relationship between the element isolating portion 10 and the pixel isolating portion 20. As illustrated in FIG. 3A, the element isolating portion 10 may have a tapered shape of which the width decreases toward the back surface 2. In addition, as illustrated in FIG. 3A, the pixel isolating portion 20 may have a tapered shape of which the width decreases toward the front surface 1. A p-type impurity region (not shown), which functions as a channel stop, that is denser than the p-type impurity region 50 of the photoelectric conversion element 30 can be disposed around the element isolating portion 10. It is desirable that the pixel isolating portion 20 be provided such that the bottom portion thereof (on the side of the front surface 1) is in contact with the impurity region serving as the channel stop. This configuration makes it possible to suppress a dark current in a similar manner to the bottom portion of the pixel isolating portion 20.

Figure 3B:
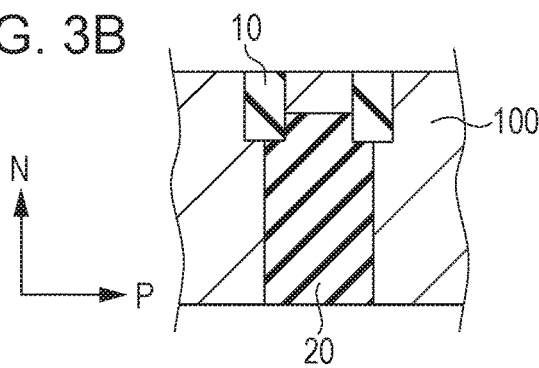

In the example illustrated in FIG. 3B, the pixel isolating portion 20 is disposed to as to extend across a plurality of isolating regions that are spaced apart from each other in the element isolating portion 10. A portion between the plurality of isolating regions is an element region. In this manner, the pixel isolating portion 20 may include a part that faces the element region.

Figure 3C:
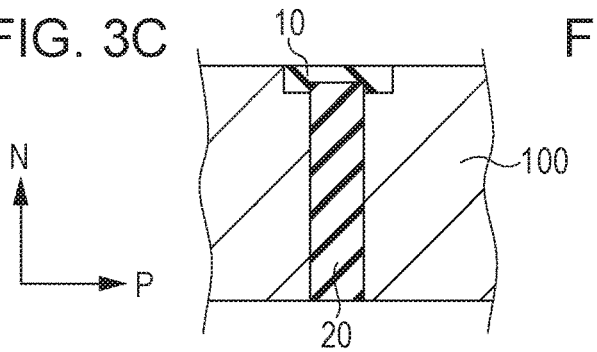

As illustrated in FIG. 3C, a portion of the pixel isolating portion 20 may be located closer to the front surface 1 (not labeled) than the lowermost surface (the side toward the back surface 2) of the element isolating portion 10 is. In FIG. 3C, side surfaces of the pixel isolating portion 20 are located closer to the inner side than the side surfaces of the element isolating portion 10 are, and an end portion of the pixel isolating portion 20 on the side toward the front surface 1 is pinched by the element isolating portion 10. In other words, it can be said that the pixel isolating portion 20 is provided so as to penetrate into the element isolating portion 10 or to extend further into the central area of the element isolating portion 10. Such a configuration makes it possible to reduce noise generated around the bottom portion of the pixel isolating portion 20. The element isolating portion 10 may be disposed such that the side surfaces thereof overlap the pixel isolating portion 20.

Figure 3D:
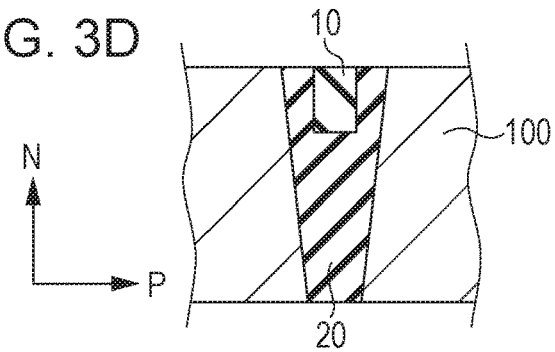

As illustrated in FIG. 3D, the pixel isolating portion 20 may have a tapered shape of which the width decreases toward the back surface 2. In addition, the pixel isolating portion 20 may be exposed in the front surface 1. Furthermore, as illustrated in FIG. 3D, the side surfaces of the element isolating portion 10 may be located closer to the inner side than the side surfaces of the pixel isolating portion 20 are, and the element isolating portion 10 may be pinched by the end portion of the pixel isolating portion 20 on the side of the front surface 1. In a side view, the element isolating portion 10 may be covered fully by the pixel isolating portion 2.

Figure 3E:
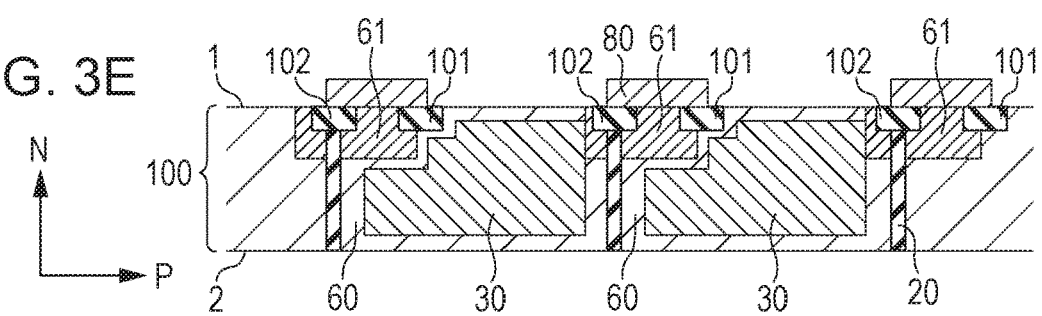
FIGS. 3E, 3F, and 3G are schematic diagrams for illustrating modifications on the configurations of the impurity regions.
Figure 3F:
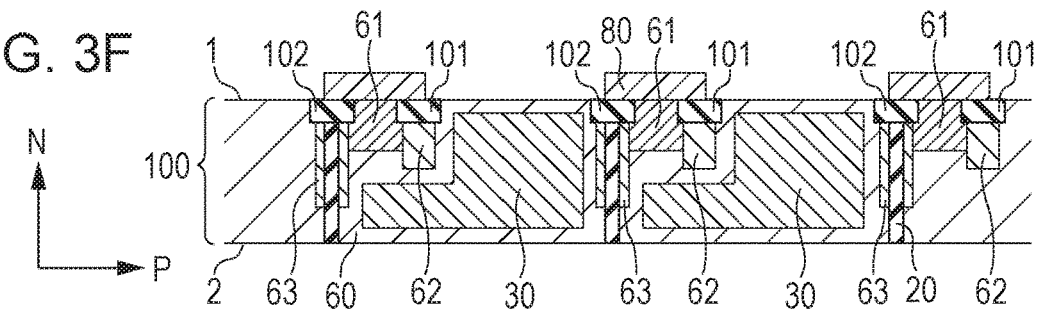
Figure 3G:
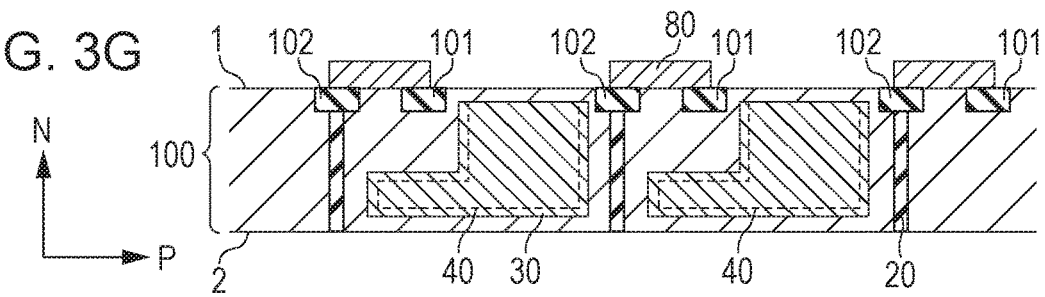

FIGS. 3E through 3G illustrate modifications on the configurations of the impurity regions 40, 50, and 60.

In the example illustrated in FIG. 3E, the impurity region 60 includes a well 61 of the pixel transistor 90. The well 61 is made asymmetric with respect to the center of the pixel transistor 90. To be more specific, a region of the well 61 that overlaps the isolating region 101 of the element isolating portion 10 is made smaller than a region of the well 61 that overlaps the isolating region 102 of the element isolating portion 10. With this configuration, the volume of the photoelectric conversion element 30 disposed underneath the isolating region 101 can be increased, and the sensitivity can thus be improved.

In the example illustrated in FIG. 3F, the depths of impurity regions 62 and 63, which are dense p-type regions that function as potential barriers, relative to the front surface 1 are made to differ from each other. The impurity region 62 is disposed in a semiconductor region corresponding to the semiconductor region 124 surrounding the pixel isolating portion 20 described with reference to FIG. 2. The impurity region 63 is disposed in a semiconductor region corresponding to the semiconductor region 125 described with reference to FIG. 2. The impurity region 63 is disposed to a greater depth than the impurity region 62 relative to the front surface 1. By disposing the impurity region 63 at a greater depth, noise generated at an interface between the pixel isolating portion 20 and the semiconductor layer 100 is less likely to be taken into the photoelectric conversion element 30. By forming the impurity region 63 disposed in the semiconductor region 125 described with reference to FIG. 2 at a greater depth relative to the front surface 1, generation of noise from the pixel isolating portion 20 can be suppressed.

In the example illustrated in FIG. 3G, the n-type impurity region 40 of the photoelectric conversion element 30 is provided so as to extend to the semiconductor region 124 and further into the semiconductor region 123 described with reference to FIG. 2. By increasing the volume of the impurity region 40 with the effective use of the semiconductor regions 124 and 123 in this manner, the sensitivity or the saturation of the photoelectric conversion element 30 can be improved.

Hereinafter, examples of the layout of the pixels will be described with reference to FIGS. 4 through 7. In the following examples, the in-plane direction P described above is divided into the X-direction and the Y-direction that intersect with (are orthogonal to) each other. In addition, the normal direction N is referred to as the Z-direction that intersects with (is orthogonal to) the X-direction and the Y-direction.

Figure 4:
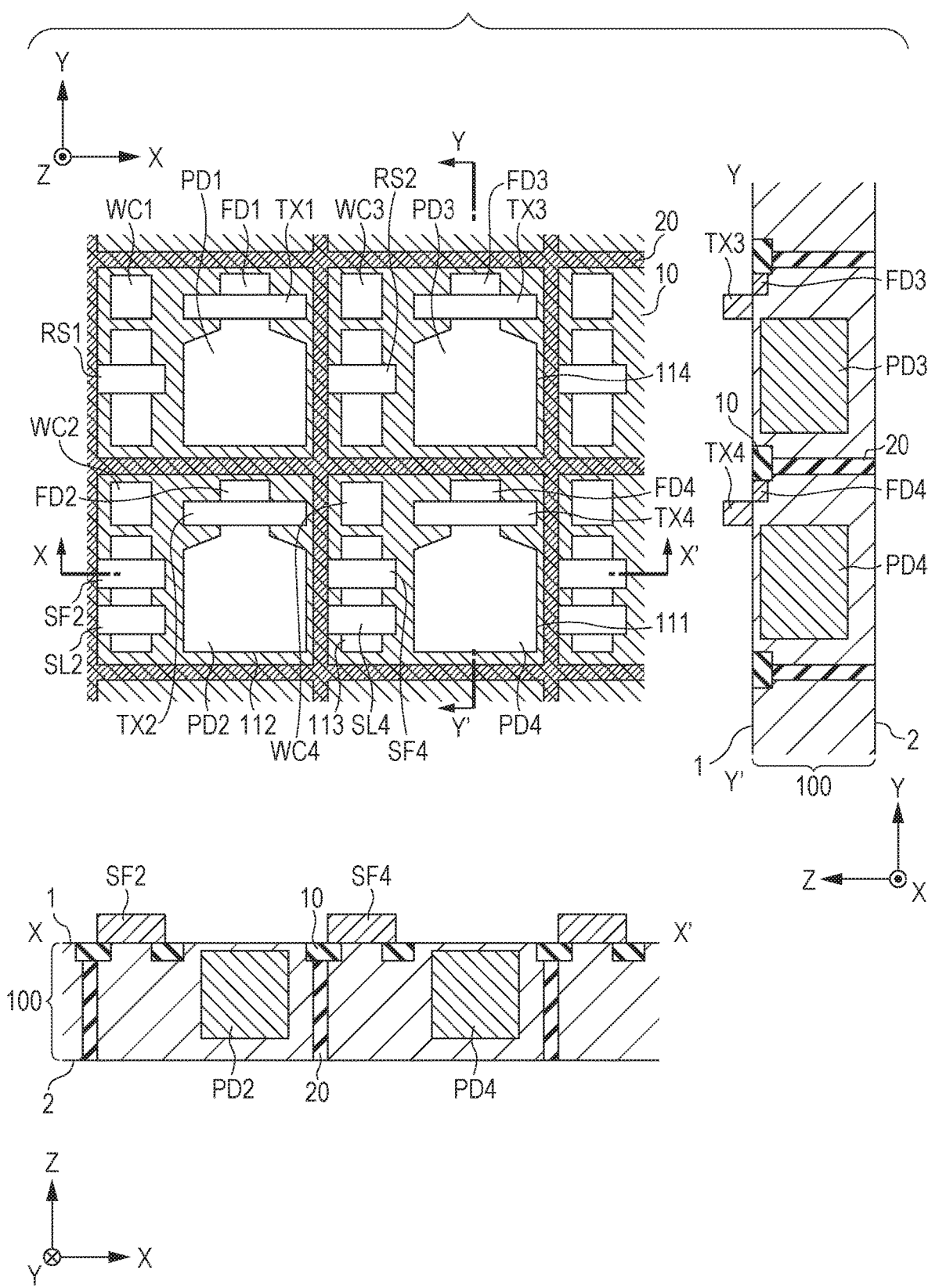
FIG. 4 is a schematic diagram for illustrating a first example of the layout of the pixels.

A first example of the layout of the pixels will be described with reference to FIG. 4. In the example illustrated in FIG. 4, the pixel isolating portion 20 defines a plurality of semiconductor region groups in the intermediate plane 3. Each of the semiconductor region groups surrounded by the pixel isolating portion 20 includes a plurality of continuous semiconductor regions that are not isolated by the pixel isolating portion 20. The plurality of semiconductor region groups that are isolated from each other are classified into semiconductor region groups Gs of a first type and semiconductor region groups Gt of a second type.

Three element regions are disposed in each of the semiconductor region groups Gs of the first type. In the following, the index m is a number of 1 or 3 and the index n is a number of 2 or 4. The significance of these indices will be explained later.

A photodiode PDm, which is a photoelectric conversion element, and a floating diffusion FDm are disposed in a first element region of the three element regions in each of the semiconductor region groups Gs.

A reset transistor RSm is disposed in a second element region of the three element regions in each of the semiconductor region groups Gs.

A well contact WCm is disposed in a third element region of the three element regions in each of the semiconductor region groups Gs. Here, m is a number of 1 or 3 determined for each of the semiconductor region groups, and PD1, PD3, RS1, RS3 and so on are appended for the respective semiconductor region groups in FIG. 4. The element region in which the photodiode PD3 is disposed corresponds to the element region 114 described with reference to FIG. 2.

Three element regions are disposed in each of the semiconductor region groups Gt of the second type. A photodiode PDn, which is a photoelectric conversion element, and a floating diffusion FDn are disposed in a first element region of the three element regions in each of the semiconductor region groups Gt. An amplification transistor SFn and a selection transistor SLn are disposed in a second element region of the three element regions in each of the semiconductor region groups Gt. A well contact WCn is disposed in a third element region of the three element regions in each of the semiconductor region groups Gt. Here, n is a number of 2 or 4 determined for each semiconductor region group, and PD2, PD4, SF2, SF4, and so on are appended for the respective semiconductor region groups in FIG. 4. The element region in which the photodiode PD2 is disposed corresponds to the element region 112 described with reference to FIG. 2, and the element region in which the photodiode PD4 is disposed corresponds to the element region 111 described with reference to FIG. 2. In addition, the element region in which the amplification transistor SF4 is disposed corresponds to the element region 113 described with reference to FIG. 2. The semiconductor regions underneath the element regions in which the well contacts WCn and WCm are disposed are continuous with the semiconductor region underneath the element region in which the photodiode PD1 is disposed, in a similar manner to the element region 113 described with reference to FIG. 2.

The well contacts WCm and WCn are connected to conductive members for supplying potentials to the impurity regions 40 of the photoelectric conversion elements 30 via the impurity regions 60. By disposing the well contacts WCn and WCm for the respective semiconductor region groups Gs and Gt as in the present example, the controllability of the potentials in the semiconductor regions included in the semiconductor region groups Gs and Gt and in the element regions in the stated semiconductor regions can be increased, and a stable image can be obtained.

Figure 5:
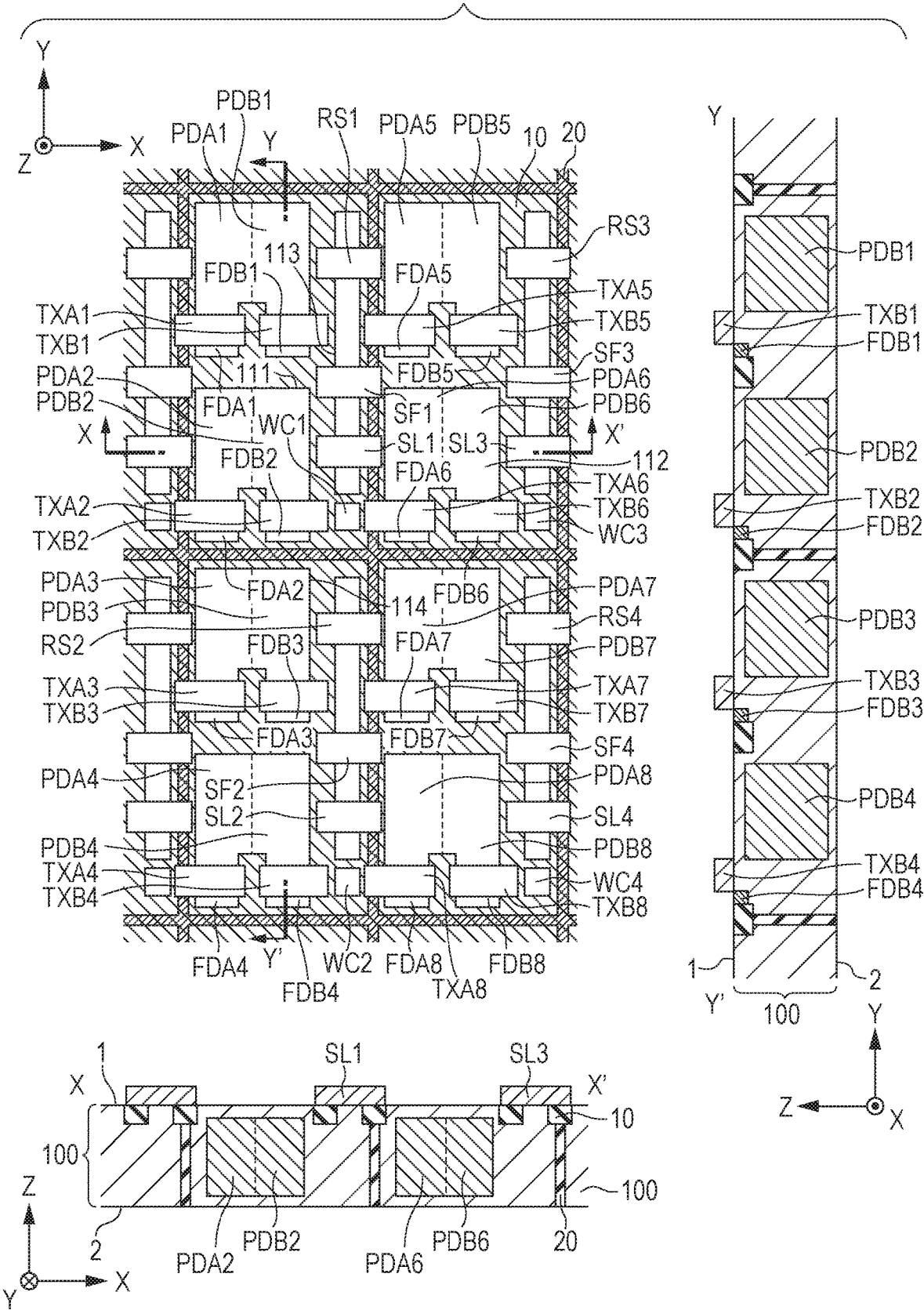
FIG. 5 is a schematic diagram for illustrating a second example of the layout of the pixels.

Next, a second example of the layout of the pixels will be described with reference to FIG. 5. In the example illustrated in FIG. 5, the pixel isolating portion 20 defines a plurality of semiconductor region groups in the intermediate plane 3. Each of the semiconductor region groups surrounded by the pixel isolating portion 20 includes a plurality of continuous semiconductor regions that are not isolated by the pixel isolating portion 20. Four element regions are disposed in each of the semiconductor region groups Gr. In the following, the index p is a number selected from 1, 3, 5, and 7; and the index q is a number selected from 2, 4, 6, and 8. The significance of these indices will be explained later.

Photodiodes PDAp and PDBp, which are photoelectric conversion elements, transfer gates TXAp and TXBp, and floating diffusions FDAp and FDBp are disposed in a first element region of the four element regions in each of the semiconductor region groups Gr. The signal charges of the photodiode PDAp are transferred to the floating diffusion FDAp via the transfer gate TXAp. The signal charges of the photodiode PDBp are transferred to the floating diffusion FDBp via the transfer gate TXBp. A common microlens is provided for the photodiodes PDAp and PDBp. In other words, the photodiodes PDAp and PDBp are provided for a single microlens. Light rays obtained through pupil division by the photodiodes PDAp and PDBp are detected separately, and range finding or focal point detection through a phase difference detection method can be carried out. In addition, by combining the signals obtained with the sensitivity of the photodiode PDAp made to differ from the sensitivity of the photodiode PDBp, the dynamic range can be broadened. In the present example, by allowing the photodiode PDBp to extend into a portion underneath the pixel transistor, the sensitivity of the photodiode PDBp can be made higher than the sensitivity of the photodiode PDAp.

Photodiodes PDAq and PDBq, which are photoelectric conversion elements, transfer gates TXAq and TXBq, and floating diffusions FDAq and FDBq are disposed in a second element region of the four element regions in each of the semiconductor region groups Gr. The signal charges of the photodiode PDAq are transferred to the floating diffusion FDAq via the transfer gate TXAq. The signal charges of the photodiode PDBq are transferred to the floating diffusion FDBq via the transfer gate TXBq. A common microlens is provided for the photodiodes PDAq and PDBq. The photodiodes PDAq and PDBq are provided for a single microlens. Light rays obtained through pupil division by the photodiodes PDAq and PDBq are detected separately, and range finding or focal point detection through a phase difference detection method can be carried out. In addition, by combining the signals obtained with the sensitivity of the photodiode PDAq made to differ from the sensitivity of the photodiode PDBq, the dynamic range can be broadened. In the present example, by allowing the photodiode PDBq to extend into a portion underneath the pixel transistor, the sensitivity of the photodiode PDBq can be made higher than the sensitivity of the photodiode PDAq.

Here, p is a number selected from 1, 3, 5, and 7 determined for the respective semiconductor region groups Gr. In FIG. 5, PDA1, PDB3, FDA1, FDB3, and so on are appended for the respective semiconductor regions Gr. The element region in which the photodiodes PDA3 and PDB3 are disposed corresponds to the element region 114 described with reference to FIG. 2.

Here, q is a number selected from 2, 4, 6, and 8 determined for the respective semiconductor region groups Gr. In FIG. 5, PDA2, PDB4, FDA2, FDB4, and so on are appended for the respective semiconductor regions Gr. The element region in which the photodiodes PDA2 and PDB2 are disposed corresponds to the element region 111 described with reference to FIG. 2. In addition, the element region in which the photodiodes PDA6 and PDB6 are disposed corresponds to the element region 112 described with reference to FIG. 2.

A reset transistor RSm, an amplification transistor SFm, and a selection transistor SLm are disposed in a third element region of the four element regions in each of the semiconductor region groups Gr. A well contact WCm is disposed in a fourth element region of the four element regions in each of the semiconductor region groups Gr.

Here, m is a number selected from 1, 2, 3, and 4 determined for the respective semiconductor region groups Gr. In FIG. 5, RS1, RS3, WC2, WC4, and so on are appended for the respective semiconductor regions Gr. Here, the relationships p=2×m−1 and q=2×m hold true. The element region in which the selection transistor SL1 is disposed corresponds to the element region 113 described with reference to FIG. 2.

By disposing the well contacts WCm for the respective semiconductor region groups Gr in the present example as in the first example, the controllability of the potentials in the semiconductor regions included in the semiconductor region groups Gr and in the element regions in the stated semiconductor regions can be increased, and a stable image can be obtained.

In addition, in the present example, the photodiodes PDAp and PDBp disposed in the first element region and the photodiodes PDAq and PDBq disposed in the second element region share the transistors RSm, SFm, and SLm disposed in the third element region. The semiconductor region underneath the element regions in which the photodiodes that share the transistors in the manner described above are disposed is not isolated by the pixel isolating portion 20 and is included in a single semiconductor region group. Such a configuration makes it possible to reduce a difference between the signals of the photodiodes PDAp and PDBp disposed in the first element region and the signals of the photodiodes PDAq and PDBq disposed in the second element region.

In addition, the pixel isolating portion 20 is disposed so as to surround the plurality of photodiodes that are adjacent to each other. A pixel transistor is provided at an intersection of regions defining the pixels. The pixel isolating portion 20 is not provided in such an intersection. The pixel isolating portion 20 surrounds the photodiodes that share the reset transistor RS, the amplification transistor SF, the selection transistor SL, or the well contact WC. According to the present example, color mixing can be suppressed, and an influence of the pixel isolating portion 20 on the transistor can be reduced.

Figure 6:
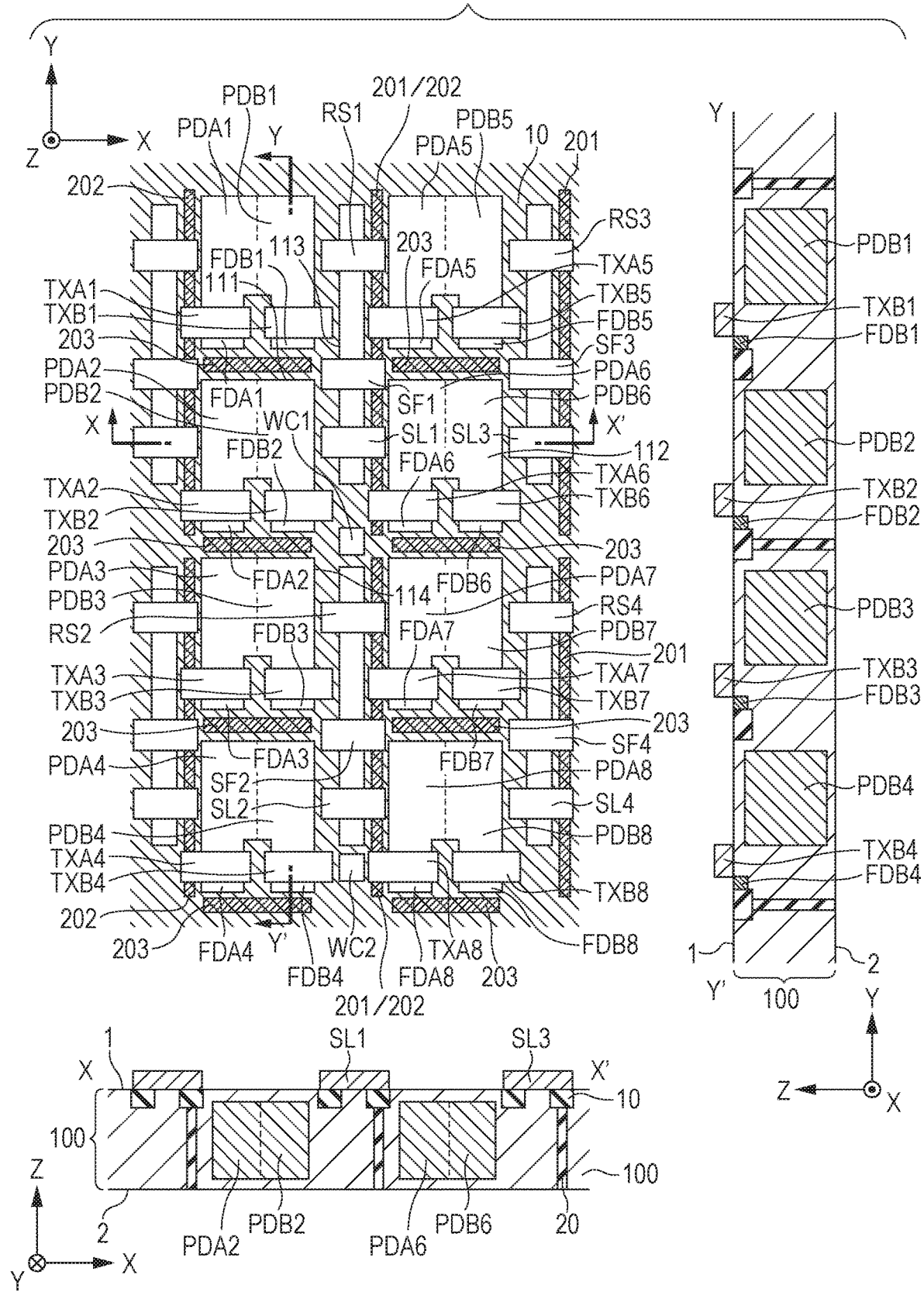
FIG. 6 is a schematic diagram for illustrating a third example of the layout of the pixels.

Next, a third example of the layout of the pixels will be described with reference to FIG. 6. In the example illustrated in FIG. 6, the first part 201 and the second part 202 of the pixel isolating portion 20 define a plurality of semiconductor region groups in the X-direction within the intermediate plane 3. Each of the semiconductor region groups sandwiched by the pixel isolating portion 20 in the X-direction includes a plurality of semiconductor regions that are continuous and are not isolated by the pixel isolating portion 20 in the X-direction. This feature is similar to that of the second example. Even the identical part of the pixel isolating portion 20 can be either of the first part 201 and the second part 202 described with reference to FIG. 2 depending on its positional relationship with respect to the photoelectric conversion element of interest, and thus a given part of the pixel isolating portion 20 is indicated as the part 201/202 in FIG. 6.

In the meantime, in the present example, each of the semiconductor region groups sandwiched by the pixel isolating portion 20 in the X-direction is isolated by a third part 203 of the pixel isolating portion 20 in the Y-direction. Such a configuration makes it possible to increase the isolation performance between the pixels in the Y-direction. It is to be noted that the third part 203 is discontinuous from the first part 201 and the second part 202. Therefore, each of the semiconductor region groups sandwiched by the pixel isolating portion 20 in the X-direction includes a semiconductor region that is continuous between the semiconductor region groups in the Y-direction.

The photodiodes PDAp and PDBp are disposed in an element region in a first semiconductor region of one semiconductor region group. The photodiodes PDAq and PDBq are disposed in an element region in a first semiconductor region of another semiconductor region group. The transistors RSm, SFm, and SLm are shared by the photodiodes PDAp and PDBp and the photodiodes PDAq and PDBq.

The semiconductor region underneath the transistors RSm, SFm, and SLm is not isolated by the pixel isolating portion 20, and the semiconductor region is continuous between the semiconductor region groups. Aside from the above, the intersection and so on of the semiconductor region groups are not isolated by the pixel isolating portion 20, and a portion in which a semiconductor region is continuous between the semiconductor region groups is provided. The reason for this is that the third part 203 disposed between the adjacent photodiodes is discontinuous from the first part 201 and the second part 202 in the pixel isolating portion 20.

By providing a part in which the pixel isolating portion 20 is not provided between the semiconductor region groups, the range in which the potential is supplied by a single well is broadened. In other words, by allowing the wells of adjacent pixels to communicate with each other by making the pixel isolating portion 20 discontinuous, the potential of the wells can be made the same. In addition, the number of the well contacts can be reduced as compared to the first example or the second example. As a result, an occurrence of noise caused by the well contacts can be suppressed.

Figure 7:
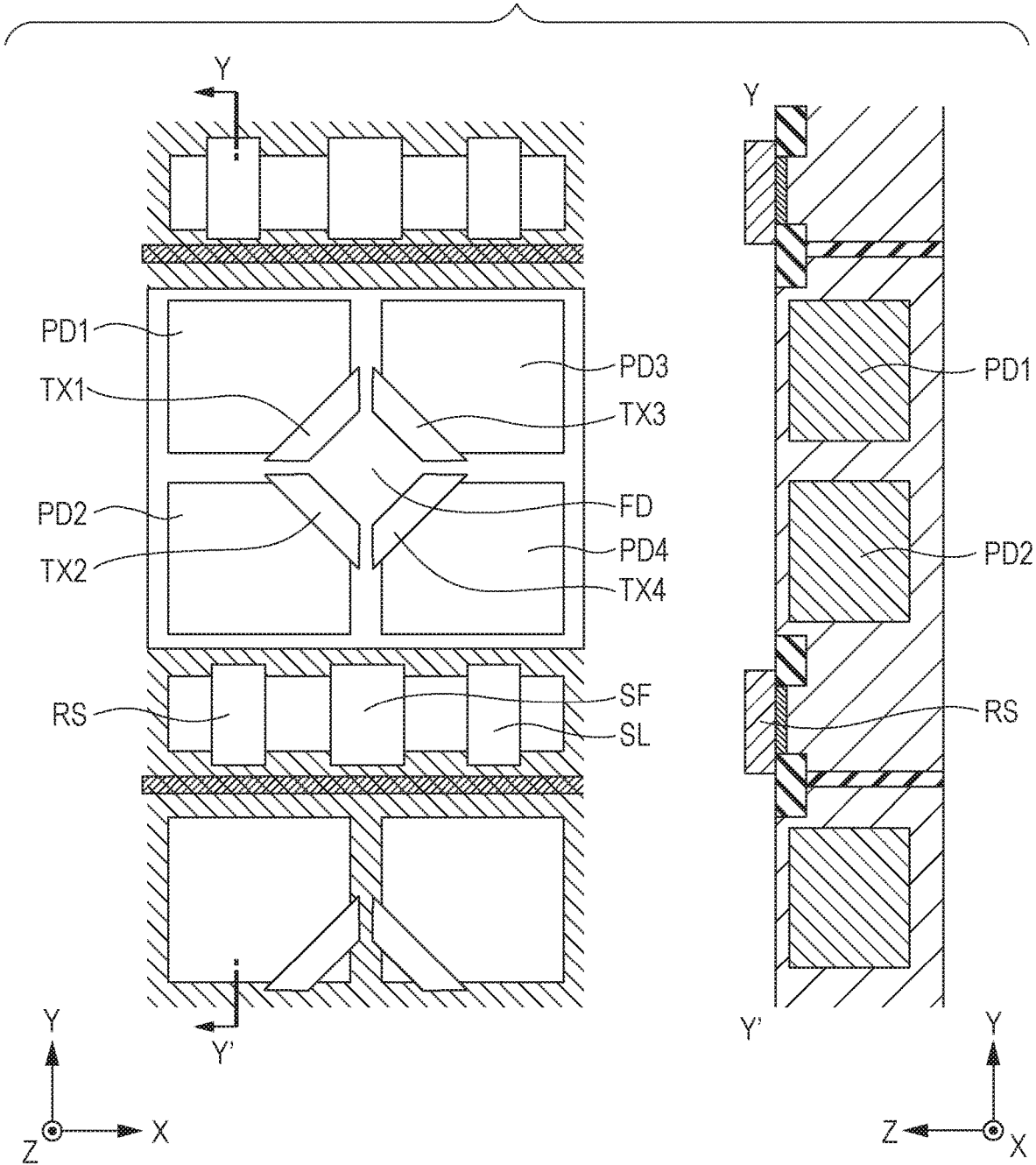
FIG. 7 is a schematic diagram for illustrating a fourth example of the layout of the pixels.

A fourth example of the layout of the pixels will be described with reference to FIG. 7. In the example illustrated in FIG. 6, the element isolating portion 10 is disposed between the photodiode and the transistor provided around the photodiode. On the other hand, the element isolating portion 10 is not provided between the adjacent photodiodes. Although not illustrated, a diffusion isolating portion of a pn-junction isolation is formed between the adjacent photodiodes. Thus, the pixel isolating portion 20 is formed so as to correspond to the element isolating portion 10 that extends along the photodiodes arrayed so as to sandwich the diffusion isolating portion.

According to this example, color mixing in the column direction or the row direction in the pixel region can be suppressed, and an influence of the pixel isolating portion 20 on the photodiodes can be reduced.

Next, with reference to FIGS. 8A through 8H, a method of manufacturing a solid-state imaging apparatus according to the present exemplary embodiment will be described.

First, in step a illustrated in FIG. 8A, the groove 11 for the element isolating portion 10 is formed in a front surface F of a semiconductor substrate SUB. A channel stop layer (not illustrated) is formed around the groove 11 through ion implantation.

Next, in step b illustrated in FIG. 8B, the insulator 12 for the element isolating portion 10 is buried into the groove 11. Silicon oxide is suitable for the insulator 12. Excess insulator outside the groove 11 is removed through chemical mechanical polishing (CMP) or the like. Thus, the element isolating portion 10 having an STI (shallow trench isolation) structure is formed.

Next, in step c illustrated in FIG. 8C, a gate insulating film (not illustrated) and the gate electrode 80 are laminated on the front surface F of the semiconductor substrate SUB, and the pixel transistor (not illustrated) is thus formed. Furthermore, the photoelectric conversion element 30 and the source-drain region of the pixel transistor are formed through ion implantation carried out from the side of the front surface F of the semiconductor substrate SUB.

Next, in step d illustrated in FIG. 8D, an insulating layer that covers the gate electrode 80 is laminated, and then a contact hole is formed in the insulating layer. Furthermore, a wiring layer and an interlayer insulating layer are laminated on the insulating layer in which the contact hole has been formed, and thus a multilayer wiring structure is formed. In the present example, the three wiring layers 310, 320, and 330 are formed. For example, a copper wire or an aluminum wire can be used for the wiring structure.

Next, in step e illustrated in FIG. 8E, the supporting substrate 400 is affixed onto the insulating film 300 from the above. The supporting substrate 400 may be affixed through bonding with an adhesive or through other well-known methods, as appropriate. However, it is preferable that the affixing be processed at a temperature of no greater than 400° C. so that the wiring structure is not affected.

Next, in step f illustrated in FIG. 8F, thinning processing is carried out from the side of a back surface B1 of the semiconductor substrate SUB until the semiconductor substrate SUB has a desired thickness. The thinning of the semiconductor substrate SUB produces a new back surface B2 in place of the back surface B1. The back surface B2 may be made to border on the photoelectric conversion element 30. For example, chemical mechanical polishing (CMP), dry etching, wet etching, or the like can be used. Alternatively, these techniques can be combined. For example, the film thickness of the thinned semiconductor substrate SUB may be in a range from 1 µm to 10 µm, and it is preferable that the film thickness be in a range from 2 µm to 5 µm from the viewpoint of improving the photoreceiving sensitivity of the photodiode or the mechanical strength of the semiconductor substrate.

Next, in step g illustrated in FIG. 8G, the groove 21 for the pixel isolating portion 20 is formed in the back surface B2 of the semiconductor substrate SUB at a position that is opposite to the element isolating portion 10 formed in the front surface F of the semiconductor substrate SUB. At this point, the depth of the groove 21 for the pixel isolating portion 20 with respect to the back surface B2 may be the depth by which the bottom portion of the pixel isolating portion 20 reaches the element isolating portion 10. For example, if the depth of the element isolating portion 10 is approximately 0.3 µm when the thickness of the semiconductor substrate SUB that has been subjected to the thinning processing is approximately 2 µm, the groove 21 to be disposed opposite to the element isolating portion 10 is formed to have a depth of approximately 1.7 µm. Such a pixel isolating portion 20 is formed through the following procedures. Here, the width of the bottom portion of the pixel isolating portion 20 may be made smaller than the width of the bottom portion of the element isolating portion 10. With this configuration, even when an alignment shift occurs, it becomes easier to bring the bottom portion of the pixel isolating portion 20 in contact with the bottom portion of the element isolating portion 10.

The groove 21 of the pixel isolating portion 20 is not provided underneath the isolating region 101, which is a portion of the element isolating portion 10, adjacent to the photoelectric conversion element 30. This configuration makes it possible to improve the photoelectric conversion performance described above.

The method of forming the pixel isolating portion 20 will be described in further detail. First, in order to form the groove 21 of the pixel isolating portion 20 in the semiconductor substrate SUB, the groove 21 having a desired width is formed, for example, with the use of anisotropic dry etching. When the groove 21 of the pixel isolating portion 20 is processed through dry etching, the element isolating portion 10 may be used to detect the terminal in the etching of the semiconductor substrate SUB. Alternatively, the etching may be carried out with the etching time specified in accordance with the film thickness of the semiconductor substrate SUB. In addition, a portion of the bottom portion of the element isolating portion 10 may be etched.

Next, in step g illustrated in FIG. 8G, the solid 22 is formed in the groove 21. First, a fixed charge film (not illustrated) for suppressing the dark current generated in the back surface 2 of the semiconductor layer 100 is formed. Thus, the fixed charge film (not illustrated) is formed so as to follow the shape of the back surface B2 of the semiconductor substrate SUB. This fixed charge film is formed at least on the back surface B2 of the semiconductor substrate SUB and may also be formed so as to cover the side walls or the bottom surface of the groove 21 of the pixel isolating portion 20. By covering the side walls and the bottom surface of the pixel isolating portion 20 with the fixed charge film in this manner, a dark current that can be generated on the front surface of the groove 21, for example, can also be suppressed. For the fixed charge film, for example, a hafnium oxide film formed through atomic layer deposition (ALD) can be used.

Next, the solid 22 made of a dielectric material, a metal material, a material with a light blocking property, or a combination of such materials is formed inside the pixel isolating portion 20 of the semiconductor substrate SUB. For example, a film of a material having a lower refractive index than silicon forming the semiconductor substrate SUB, such as a silicon oxide film or a titanium oxide film, is formed on the fixed charge film. Subsequently, a conductive material is buried with the use of chemical vapor deposition (CVD) or atomic layer deposition (ALD), and the pixel isolating portion 20 can thus be formed. Alternatively, a silicon oxide film is formed on the fixed charge film with the use of atomic layer deposition (ALD), and then another silicon oxide film is deposited thereon with the use of high density plasma (HDP) CVD. In this manner, the pixel isolating portion 20 may be formed by burying with two-layer structure insulating film. In particular, a material that can be formed at a low temperature of no greater than 400° C. is preferable, and it is desirable that amorphous silicon doped with a P-type impurity, copper, tungsten, or the like be deposited through chemical vapor deposition (CVD) or atomic layer deposition (ALD). Here, the fixed charge film described above may be used as the solid 22.

Although an example in which the solid 22 is buried into the pixel isolating portion 20 has been described above, the structure of the inside of the groove 21 is not limited thereto, and any well-known structure and manufacturing method that can suppress color mixing can be employed. In addition, a portion or the entirety of the groove 21 of the pixel isolating portion 20 may be hollow, for example.

Although a case in which the pixel isolating portion 20 is formed from the side of the back surface B2 of the semiconductor substrate has been described in the present example, the method of forming the pixel isolating portion 20 is not limited to the method described herein. For example, the groove 21 may be formed from the side of the front surface F of the semiconductor substrate SUB before the element isolating portion 10 is formed as described in steps a and b.

Thereafter, the structure illustrated in FIG. 1A is formed. The dielectric film 410 is formed on the back surface B2 of the semiconductor substrate SUB, and the light blocking member 420 is patterned between the pixels on the dielectric film 410. The light blocking member 420 is formed through a process of removing a portion other than a portion that requires a light blocking structure including a portion between the pixels after the film deposition through sputtering or chemical vapor deposition (CVD). As the material for the light blocking member 420, for example, a laminated film of titanium and tungsten, a laminated film of titanium nitride and tungsten, or the like can be used.

Next, a planarizing film (not illustrated) is formed, the color filter array 430 of, for example, red, green, and blue corresponding to the respective pixels is formed on the planarizing film, and the microlens array 440 is formed on the color filter array 430. The color filters and the microlenses are formed so as to correspond to the respective pixels of the pixel array. With the method described above, the photoelectric conversion apparatus is completed. The semiconductor substrate SUB is used as the semiconductor layer 100 described above.

According to the examples described above, by allowing the pixel isolating portion 20 to extend in the depthwise direction to the element isolating portion 10, color mixing between the adjacent pixels can be suppressed effectively. The pixel isolating portion 20 can be disposed so as to surround not only the photoelectric conversion element but also the semiconductor region underneath the element region in which the transistors and so on are provided. This configuration makes it possible to broaden the range in which photoelectric conversion is carried out by the photoelectric conversion element.

Figure 9:
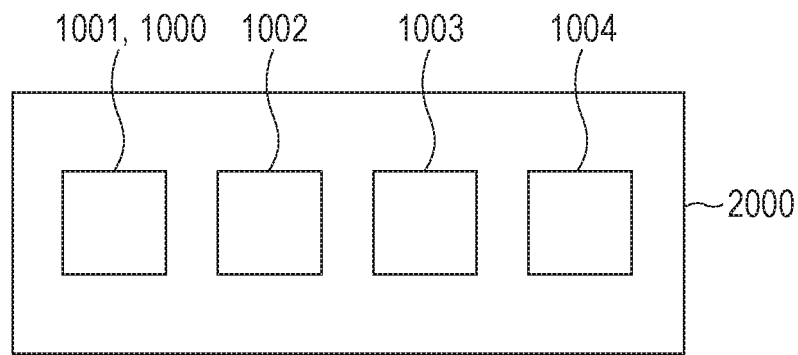
FIG. 9 is a schematic diagram of a camera.

The photoelectric conversion apparatus 1000 described thus far can be applied to an imaging apparatus 1001 (image sensor) of a camera 2000 shown in FIG. 9.

The camera 2000 can include, aside from the imaging apparatus 1001, at least one of a signal processing device 1002 that processes a signal obtained from the imaging apparatus, a storage device 1003 that stores a signal obtained from the imaging apparatus, and a display device 1004 that displays information obtained by the imaging apparatus. The camera 2000 as used herein includes, aside from a camera dedicated apparatus such as a still camera, a video camera, and a surveillance camera, an information terminal provided with an imaging function and a moving body (vehicle, flying object, etc.) provided with an imaging function.

Even when there is no clear statement in the present specification, features that can be grasped from the appended drawings and common general technical knowledge constitute a portion of the present disclosure. The present disclosure can be modified as appropriate within the scope that does not depart from the technical spirit of the present disclosure.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A photoelectric conversion apparatus comprising:
   a semiconductor layer having a first surface and a second surface being opposite to the first surface,
   wherein the semiconductor layer includes
   a first region where at least four photoelectric conversion elements are provided,
   a first isolating portion constituted by a first groove and including a first insulator arranged in the first groove, the first groove provided in the semiconductor layer and passing through a virtual plane located closer to the second surface than the first surface and provided along the second surface, and
   a second isolating portion constituted by a second groove and including a second insulator arranged in the second groove, the second groove provided in the semiconductor layer and passing through the virtual plane,
   wherein the first region is located at a position between the first isolating portion and the second isolating portion in planar view, and
   wherein the semiconductor layer extends from the first groove to the second groove through the first region in the virtual plane.

2. The photoelectric conversion apparatus according to claim 1,
   wherein the semiconductor layer includes a third isolating portion including a third insulator and disposed on a side of the first surface, and a first transistor including a gate electrode disposed on the first surface and configured to read a signal from the at least four photoelectric conversion elements, and
   wherein the first isolating portion, the first region, the third isolating portion, the first transistor, and the second isolating portion are disposed in this order.

3. The photoelectric conversion apparatus according to claim 2,
   wherein the at least four photoelectric conversion elements are disposed in a first element region and the first transistor is disposed in a second element region, and
   wherein the first element region and the second element region are defined by the third isolating portion.

4. The photoelectric conversion apparatus according to claim 2,
   wherein the semiconductor layer further includes another photoelectric conversion element, the third isolating portion including the third insulator and disposed on the side of the first surface, and a fourth isolating portion including a fourth insulator and disposed on the side of the first surface,
   wherein the first isolating portion, the first region, the third isolating portion, the first transistor, the second isolating portion, and the other photoelectric conversion element are disposed in this order, and
   wherein the second isolating portion is superimposed on the fourth isolating portion in planar view.

5. The photoelectric conversion apparatus according to claim 4,
   wherein the semiconductor layer further includes a second transistor and a fifth isolating portion including a fifth insulator and disposed on the side of the first surface,
   wherein the second transistor, the first isolating portion, the first region, the third isolating portion, the first transistor, the second isolating portion, and the other photoelectric conversion element are disposed in this order, and
   wherein the second isolating portion is superimposed on the fourth isolating portion, and the first isolating portion is superimposed on the fifth isolating portion in planar view.

6. The photoelectric conversion apparatus according to claim 1,
   wherein the at least four photoelectric conversion elements each include a first impurity region of a first conductivity type in which a signal charge is a majority carrier,
   wherein the semiconductor layer includes a second impurity region of a second conductivity type in which a signal charge is a minority carrier, and
   wherein the second impurity region is located between two semiconductor regions of the first conductivity type.

7. The photoelectric conversion apparatus according to claim 1,
   wherein the at least four photoelectric conversion elements include a first photoelectric conversion element, a second photoelectric conversion element, a third photoelectric conversion element, and a fourth photoelectric conversion element, and
   wherein the first photoelectric conversion element and the fourth photoelectric conversion element are disposed along a first direction and the second photoelectric conversion element and the third photoelectric conversion element are disposed along a second direction intersecting with the first direction, in planar view.

8. The photoelectric conversion apparatus according to claim 7,
   wherein the semiconductor layer includes a floating diffusion region to which charges generated in the at least four photoelectric conversion elements are transferred, a first transfer transistor configured to control connection between the first photoelectric conversion element and the floating diffusion region, a second transfer transistor configured to control connection between the second photoelectric conversion element and the floating diffusion region, a third transfer transistor configured to control connection between the third photoelectric conversion element and the floating diffusion region, and a fourth transfer transistor configured to control connection between the fourth photoelectric conversion element and the floating diffusion region, and wherein the floating diffusion region is located between the first photoelectric conversion element and the fourth photoelectric conversion element, and located between the second photoelectric conversion element and the third photoelectric conversion element, in planar view.

9. The photoelectric conversion apparatus according to claim 8,
wherein the semiconductor layer includes a first transistor having a gate electrode disposed on the first surface, and configured to read a signal from the at least four photoelectric conversion elements, and
wherein a first virtual line passing through a source and a drain of the first transistor is parallel to a second virtual line passing through the second photoelectric conversion element and the fourth photoelectric conversion element in planar view.

10. The photoelectric conversion apparatus according to claim 9, wherein the first isolating portion extends along a direction parallel to the first virtual line.

11. The photoelectric conversion apparatus according to claim 1, wherein a fixed charge film is provided in the first groove of the first isolating portion.

12. The photoelectric conversion apparatus according to claim 1, wherein the first groove of the first isolating portion is at least partially hollow.

13. A camera comprising:
the photoelectric conversion apparatus according to claim 1; and
at least one of a signal processing apparatus configured to process a signal obtained from the photoelectric conversion apparatus, a storage apparatus configured to store a signal obtained from the photoelectric conversion apparatus, and a display apparatus configured to display information obtained by the photoelectric conversion apparatus.

14. The photoelectric conversion apparatus according to claim 1,
wherein the semiconductor layer includes a first well for a first photoelectric conversion element included in the at least four photoelectric conversion elements, and the semiconductor layer includes a second well for a second photoelectric conversion element included in the at least four photoelectric conversion elements,
wherein the first well and the second well communicate with each other.

15. A photoelectric conversion apparatus comprising:
a semiconductor layer having a first surface and a second surface being opposite to the first surface,
wherein the semiconductor layer includes a first region where a first photoelectric conversion element is disposed, a second region where a second photoelectric conversion element is disposed, and a first isolating portion constituted by a first groove and including a first insulator arranged in the first groove, the first groove provided in the semiconductor layer and passing through a virtual plane located closer to the second surface than the first surface and provided along the second surface, wherein the first photoelectric conversion element, the first isolating portion, and the second photoelectric conversion element are disposed along a first direction in this order, wherein a longitudinal direction of the first isolating portion extends along a virtual line intersecting with the first direction, in planar view, and wherein the semiconductor layer includes a well contact for supplying a potential to wells in the first region and the second region, and the well contact is located on the virtual line in planar view.

16. The photoelectric conversion apparatus according to claim 15, wherein the well contact is surrounded by a second isolating portion including a second insulator disposed on a side of the first surface in planar view.

17. The photoelectric conversion apparatus according to claim 16,
wherein the first region includes a first transistor including a first gate electrode disposed on the first surface and configured to read a signal from the first photoelectric conversion element, and the second region includes a second transistor including a second gate electrode disposed on the first surface and configured to read a signal from the second photoelectric conversion element.

18. The photoelectric conversion apparatus according to claim 17,
wherein the first gate electrode is disposed on the second isolating portion.

19. A camera comprising:
the photoelectric conversion apparatus according to claim 15; and
at least one of a signal processing apparatus configured to process a signal obtained from the photoelectric conversion apparatus, a storage apparatus configured to store a signal obtained from the photoelectric conversion apparatus, and a display apparatus configured to display information obtained by the photoelectric conversion apparatus.

20. The photoelectric conversion apparatus according to claim 15,
wherein the wells in the first region and the second region communicate with each other.

21. A photoelectric conversion apparatus comprising:
a semiconductor layer having a first surface and a second surface being opposite to the first surface,
wherein the semiconductor layer includes
a first region including a first photoelectric conversion element,
a second region including a second photoelectric conversion element,
a third region including a third photoelectric conversion element,
a fourth region including a fourth photoelectric conversion element,
a first isolating portion constituted by a first groove and including a first insulator arranged in the first groove, the first groove provided in the semiconductor layer and passing through a virtual plane located closer to the second surface than the first surface and provided along the second surface, and a second isolating portion constituted by a second groove and including a second insulator arranged in the second groove, the second groove provided in the semiconductor layer and passing through the virtual plane, wherein the first photoelectric conversion element, the first isolating portion, and the second photoelectric conversion element are disposed along a first direction in this order, the third photoelectric conversion element, the second isolating portion, and the fourth photoelectric conversion element are disposed along a second direction in this order, wherein a longitudinal direction of the first isolating potion extends along a direction intersecting with the first direction, and a longitudinal direction of the second isolating potion extends along a direction intersecting the second direction, and wherein the semiconductor layer has a well contact supplying a potential to wells of the first region and the second region, and the well contact is located between the first isolating portion and the second isolating portion, in planar view.

22. The photoelectric conversion apparatus according to claim 21, wherein the well contact is located between the first photoelectric conversion element and the fourth photoelectric conversion element and located between the second photoelectric conversion element and the third photoelectric conversion element, in planar view.

23. The photoelectric conversion apparatus according to claim 22, wherein the well contact and the first isolating portion are located along the direction intersecting with the first direction, in planar view.

24. The photoelectric conversion apparatus according to claim 21, wherein the first photoelectric conversion element, the well contact, and the fourth photoelectric conversion element are located along a third direction and the second photoelectric conversion element, the well contact, and the third photoelectric conversion element are located along a fourth direction intersecting with the third direction, in planar view.

25. The photoelectric conversion apparatus according to claim 21, wherein the first photoelectric conversion element, the second photoelectric conversion element, the third photoelectric conversion element, and the fourth photoelectric conversion element each include a first impurity region of a first conductivity type in which a signal charge is a majority carrier and a second impurity region of a second conductivity type in which a signal charge is a minority carrier, and wherein the second impurity region of the first photoelectric conversion element, the second impurity region of the second photoelectric conversion element, the second impurity region of the third photoelectric conversion element, and the second impurity region of the fourth photoelectric conversion element communicate with each other.

26. The photoelectric conversion apparatus according to claim 25, wherein the well contact includes a third impurity region of the second conductivity type to which a conductive member is connected and having an impurity concentration higher than an impurity concentration of the second impurity region of the first photoelectric conversion element.

27. A camera comprising:

the photoelectric conversion apparatus according to claim 21; and at least one of a signal processing apparatus configured to process a signal obtained from the photoelectric conversion apparatus, a storage apparatus configured to store a signal obtained from the photoelectric conversion apparatus, and a display apparatus configured to display information obtained by the photoelectric conversion apparatus.

28. The photoelectric conversion apparatus according to claim 21, wherein the wells in the first region and the second region communicate with each other.

29. The photoelectric conversion apparatus according to claim 28, wherein the well contact supplies the potential to wells of the third region and the fourth region, and the wells in the first region, the second region, the third region and the fourth region communicate with each other.

* * * * *